(12) United States Patent
Wakisaka et al.

(10) Patent No.: US 7,427,812 B2
(45) Date of Patent: Sep. 23, 2008

(54) SEMICONDUCTOR DEVICE WITH INCREASED NUMBER OF EXTERNAL CONNECTION ELECTRODES

(75) Inventors: Shinji Wakisaka, Hanno (JP); Hiroyasu Jobetto, Hachioji (JP)

(73) Assignee: Casio Computer Co., Ltd., Tokyo (JP)

( * ) Notice: Subject to any disclaimer, the term of this patent is extended or adjusted under 35 U.S.C. 154(b) by 176 days.

(21) Appl. No.: 11/078,175

(22) Filed: Mar. 11, 2005

(65) Prior Publication Data
US 2005/0200018 A1 Sep. 15, 2005

(30) Foreign Application Priority Data
Mar. 15, 2004 (JP) ............... 2004-072265

(51) Int. Cl.
*H01L 23/48* (2006.01)
*H01L 23/52* (2006.01)

(52) U.S. Cl. .................. 257/786; 257/692; 257/738

(58) Field of Classification Search ......... 257/690–697, 257/737, 738, 786, E23.01, E23.021, E23.069
See application file for complete search history.

(56) References Cited

U.S. PATENT DOCUMENTS
5,805,422 A * 9/1998 Otake et al. ............... 361/749

2004/0183205 A1 * 9/2004 Yamaguchi ................. 257/774

FOREIGN PATENT DOCUMENTS

| JP | 59-124748 A | 7/1984 |
| JP | 06-053272 A | 2/1994 |
| JP | 07-074203 A | 3/1995 |
| JP | 07-086330 A | 3/1995 |
| JP | 08-279535 A | 10/1996 |
| JP | 10-233462 A | 9/1998 |
| JP | 2000-022052 A | 1/2000 |
| JP | 2003-298005 A | 10/2003 |

* cited by examiner

*Primary Examiner*—Hung Vu
(74) *Attorney, Agent, or Firm*—Frishauf, Holtz, Goodman & Chick, P.C.

(57) ABSTRACT

The semiconductor device of the present invention has a semiconductor substrate having a top surface of a quadrangular shape on which a plurality of connection pads are formed, an insulation film formed on the semiconductor substrate except the connection pads, and a plurality of external connection electrodes formed on the insulation film so as to be connected to the connection pads. The plurality of external connection electrodes constitute at least a first group of external connection electrodes which are arranged on first lines running along each of the two diagonal lines of the semiconductor substrate and second group of external connection electrodes which are arranged on second lines running along the first lines outside the first lines as seen from the diagonal lines.

18 Claims, 15 Drawing Sheets

SEMICONDUCTOR DEVICE WITH INCREASED NUMBER OF EXTERNAL CONNECTION ELECTRODES

BACKGROUND OF THE INVENTION

1. Field of the Invention

The present invention relates to a semiconductor device, and particularly relates to a semiconductor device in which multiple external connection electrodes can be arranged.

2. Description of the Related Art

There conventionally exists a so-called CSP (Chip Size Package) semiconductor device. The CSP is constructed on a semiconductor substrate on which a plurality of connection pads are formed, and wires are laid on the connection pads via an insulation film so as to be connected to the connection pads. Columnar electrodes are formed on the connection pad portions of the wires and a sealing film is formed on the wires and the insulation film in a manner that the top surface of the sealing film constitutes the same surface as the top surfaces of the columnar electrodes (see, for example, Unexamined Japanese Patent Application KOKAI Publication No. 2000-22052, FIG. 8).

There is another type of conventional semiconductor device which has solder balls as external connection terminals outside the range of the semiconductor substrate included in the device. In this device, a semiconductor substrate having a plurality of connection pads thereon is formed on a base plate, and an insulation layer is formed on the base plate portion that appears around the semiconductor substrate. An upper insulation film is formed on the semiconductor substrate and the insulation layer, and upper wires are provided on the upper insulation film so as to be connected to the connection pads on the semiconductor substrate. The portions other than the connection pad portions of the upper wires are covered with an overcoat film, and solder balls are formed on the connection pad portions of the upper wires (see, for example, Unexamined Japanese Patent Application KOKAI Publication No. 2003-298005).

It is now possible that the semiconductor device disclosed in Unexamined Japanese Patent Application KOKAI Publication No. 2000-22052 (the semiconductor device will hereinafter be referred to as semiconductor element) having the columnar electrodes be formed on the base plate disclosed in the Unexamined Japanese Patent Application KOKAI Publication No. 2003-298005 instead of the semiconductor substrate disclosed therein. To be more specific, it is possible that the semiconductor element having the columnar electrodes be formed on the base plate, an insulation layer be formed on the base plate portion that appears around the semiconductor element, an upper insulation film be formed on the semiconductor element and the insulation layer, upper wires are provided on the upper insulation film so as to be connected to the columnar electrodes of the semiconductor element, the portions other than the connection pad portions of the upper wires be covered with an overcoat film, and solder balls be formed on the connection pad portions of the upper wires.

In a case where the diameter of the columnar electrode is 120 μm, the state-of-the-art manufacture techniques tolerate about 200 μm as the limit of the arranging pitch for the columnar electrodes, and about 70 μm as the limit of the arranging pitch for the upper wires (wire width being about 35 μm and wire interval being about 35 μm). In this case, the interval between the columnar electrodes having the diameter of 120 μm and arranged with the arranging pitch of 200 μm is 80 μm, and therefore the number of upper wires having the wire width of 35 μm that can be arranged on the upper insulation film within the interval of 80 μm is 1.

If the largest number of columnar electrodes possible under the above-described conditions are arranged on the circumferential region of a semiconductor substrate having the size of 5 mm×5 mm, the semiconductor substrate will be as shown in FIG. 19. That is, in a case where a semiconductor substrate 41 is a square each side of which has a length of 5 mm and columnar electrodes 42 having a diameter of 120 μm are arranged along each side with an arranging pitch of 200 μm, the number of columnar electrodes 42 is 24 according to a calculation "(5000÷200)−1=24" and the total number thereof along the four sides is 92 according to a calculation "(24−1)×4=92". That is, the total number of columnar electrodes 42 that are arranged for the first round along the four sides of the semiconductor substrate 41 is 92.

Further, since upper wires 44 can be arranged on the upper insulation film 43 within the intervals between the respective 92 columnar electrodes 42 arranged along the four sides on the basis of one wire for each interval as shown in FIG. 20, further columnar electrodes 42 can be arranged inside and along the 92 columnar electrodes 42 arranged along the four sides as shown in FIG. 19. In this case, the number of the second round of columnar electrodes 42 arranged along the first round of columnar electrodes 42 is 22 per side, smaller by 2 than the number of columnar electrode 42 arranged outside (first round). That is, the total number of the second round of columnar electrodes 42 arranged along the four sides of the semiconductor substrate 41 is 84 according to a calculation "(22−1)×4=84". Further, since there occur 8 intervals in which no wire is arranged between the columnar electrodes 42 as shown in FIG. 20 when the columnar electrodes 42 are arranged two rounds as described above, 8 more columnar electrodes 42 can be arranged for the third round inside the 84 columnar electrodes 42 arranged for the second round. As a result, in the conventional structure in which the columnar electrodes 42 are arranged as shown in FIG. 19 and FIG. 20, the total number of columnar electrodes 42 is 184 according to a calculation "(92+84+8)=184".

SUMMARY OF THE INVENTION

As described above, the number of columnar electrodes 42 that can be arranged in a semiconductor device having the above-described columnar electrode arrangement is limited to 184 at the most, and a larger number of columnar electrodes 42 than that cannot be arranged.

It is therefore an object of the present invention to provide a semiconductor device in which multiple external connection electrodes can be arranged.

The semiconductor device of the present invention has a semiconductor substrate having a top surface of a quadrangular shape on which a plurality of connection pads are formed, an insulation film formed on the semiconductor substrate except the connection pads, and a plurality of external connection electrodes formed on the insulation film so as to be connected to the connection pads. The plurality of external connection electrodes constitute at least a first group of external connection electrodes which are arranged on first lines running along each of the two diagonal lines of the semiconductor substrate and a second group of external connection electrodes which are arranged on second lines running along the first lines outside the first lines as seen from the diagonal lines.

BRIEF DESCRIPTION OF THE DRAWINGS

These objects and other objects and advantages of the present invention will become more apparent upon reading of the following detailed description and the accompanying drawings in which.

DETAILED DESCRIPTION OF THE PREFERRED EMBODIMENTS

Figure 1:
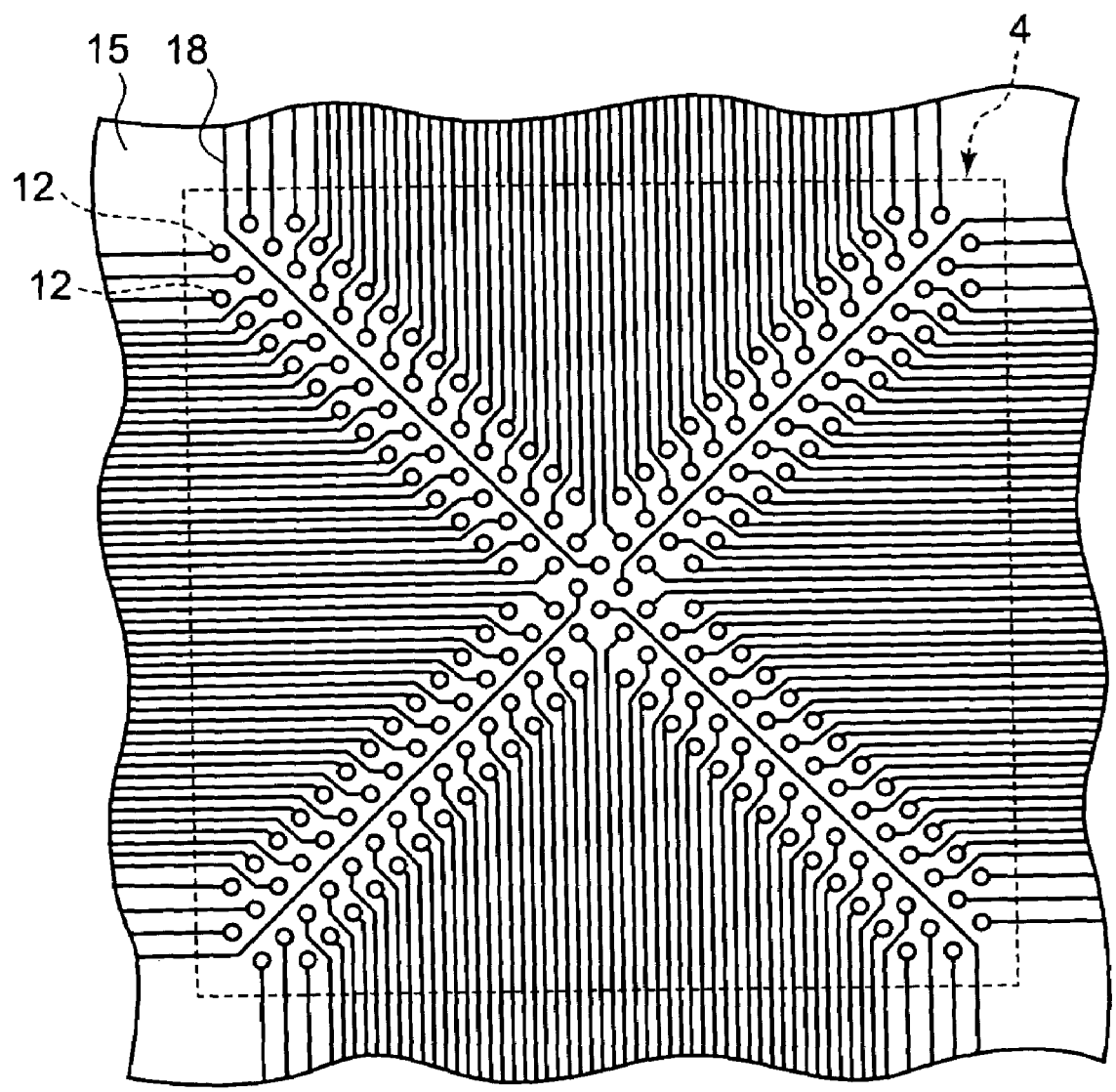
FIG. 1 is a top view of the principal part of a semiconductor device as one embodiment of the present invention.
Figure 2:
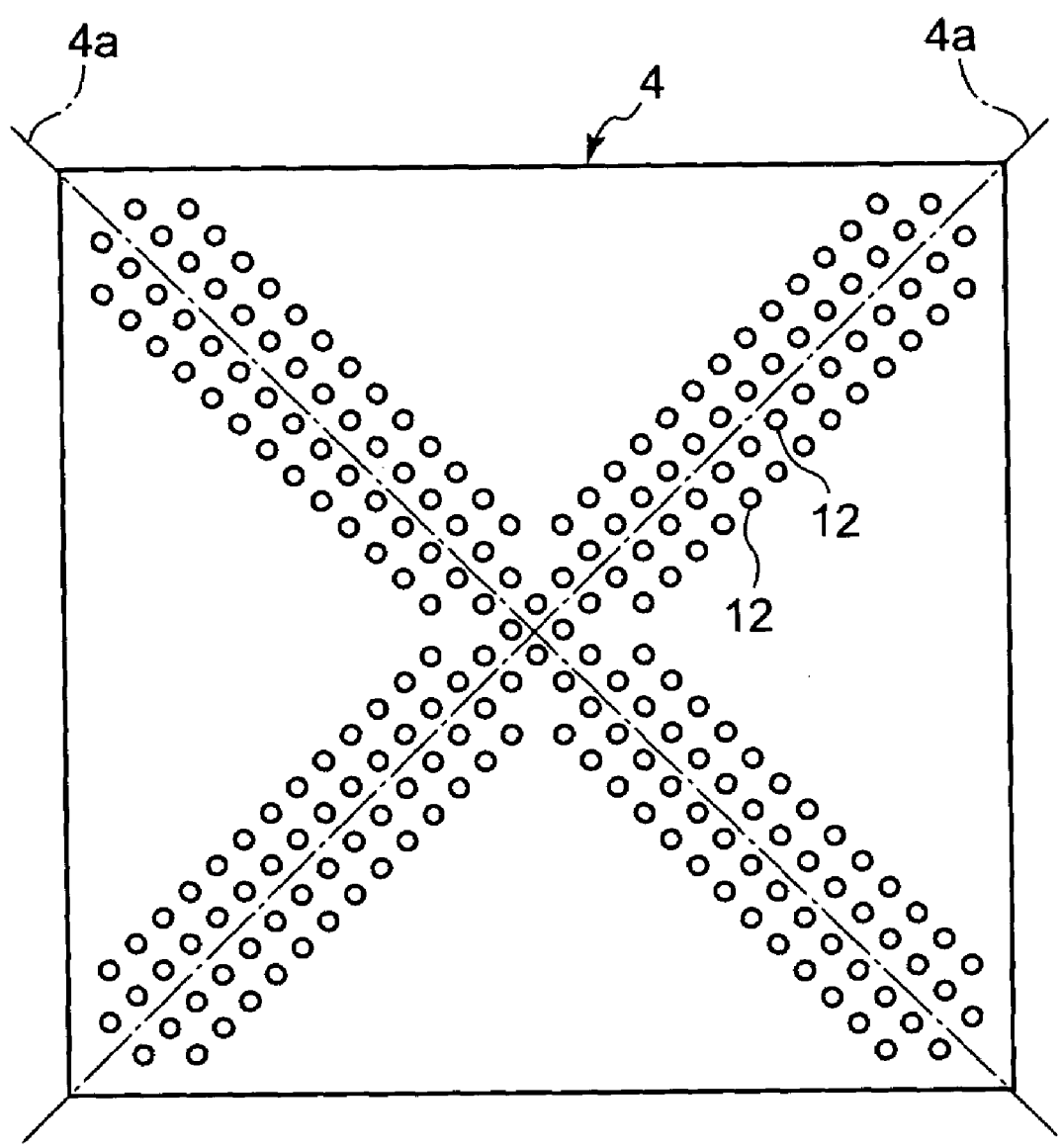
FIG. 2 is a top view of a semiconductor element included in the semiconductor device shown in FIG. 1.
Figure 3:
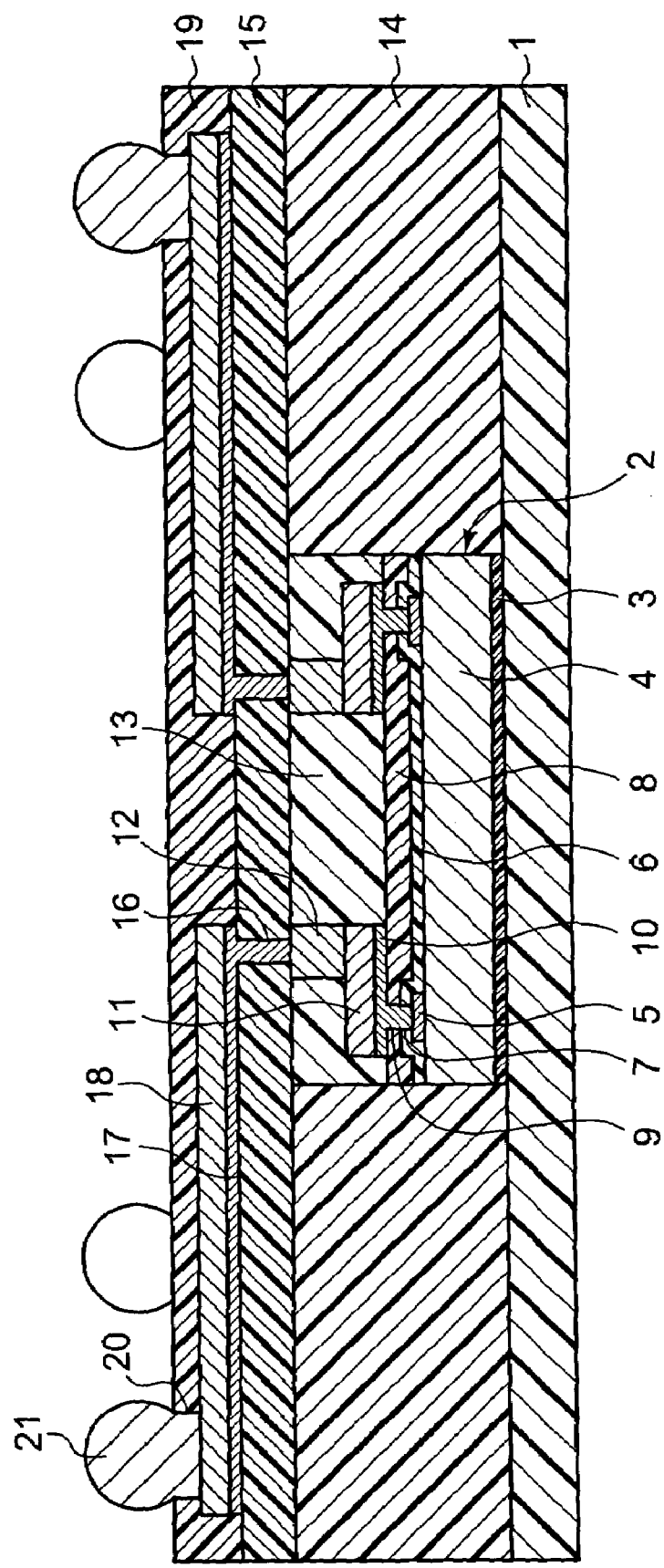
FIG. 3 is a vertical cross section of a sample part of the semiconductor device shown in FIG. 1.

FIG. 1 shows a top view of the principal part of a semiconductor device as one embodiment of the present invention. FIG. 2 shows a top view of a semiconductor element included in the semiconductor device shown in FIG. 1. FIG. 3 shows a vertical cross section of a sample part of the semiconductor device shown in FIG. 1. Note that the dimensions of each component shown are not identical in FIG. 1, FIG. 2, and FIG. 3 for the illustrative purposes. First, with reference to FIG. 3, the semiconductor device comprises a base plate 1 made of an epoxy resin permeated into a glass fabric base or the like and having a square shape as seen from the top.

The lower surface of a semiconductor element 2 having a square shape as seen from the top which is substantially smaller in size than the square shape of the base plate 1 is adhered, via an adhesive layer made of a die bond material, to the central region of the upper surface of the base plate 1. In this case, the semiconductor element 2 comprises wires 11, columnar electrodes 12, and a sealing film 13 which are to be described later, and is generally called CSP. The semiconductor element 2 according to the present invention is particularly called wafer level CSP (W-CSP) because it is obtained by dicing a silicon wafer on which the wires 11, the columnar electrodes 12, and the sealing film 13 have been formed, as will be described later. The configuration of the semiconductor element 2 will now be explained.

The semiconductor element 2 comprises a silicon substrate (semiconductor substrate) 4. The lower surface of the silicon substrate 4 is adhered to the upper surface of the base plate 1 via the adhesive layer 3. An integrated circuit (unillustrated) having a specific function is formed on the upper surface of the silicon substrate 4, and a plurality of connection pads 5 made of aluminum metal or the like are formed on the circumferential region of the upper surface of the silicon substrate 4 so as to be connected to the integrated circuit. An insulation film 6 made of silicon oxide or the like is formed on the upper surface of the silicon substrate 4 except the central regions of the connection pads 5. The central regions of the connection pads 5 are exposed through openings 7 provided in the insulation film 6.

A protection film (insulation film) 8 made of an epoxy resin, a polyimide resin, or the like is formed on the upper surface of the insulation film 6. In this case, openings 9 are formed in the portions of the protection film 8 corresponding to the openings 7 of the insulation film 6. A base metal layer 10 made of copper or the like is formed on the upper surface of the protection film 8. Wires 11 made of copper are formed on the entire upper surface of the base metal layer 10. One end portion of the wire 11 including the corresponding portion of the base metal layer 10 is connected to connection pad 5 through both the openings 7 and 9.

Columnar electrodes (external connection electrodes) 12 made of copper are formed on the upper surfaces of the connection pad portions of the wires 11. A sealing film 13 made of an epoxy resin, a polyimide resin, or the like is formed on the upper surface of the protection film 8 including the upper surfaces of the wires 11 in a manner that the upper surface of sealing film 13 constitutes the same surface as the upper surfaces of the columnar electrodes 12. As described above, the semiconductor element 2 called W-CSP is formed of the silicon substrate 4, the connection pads 5, the insulation film 6, the protection film 8, the wires 11, the columnar electrodes 12, and the sealing film 13.

A quadrangular-frame-like insulation layer 14 is formed on the upper surface of the base plate 1 around the semiconductor element 2 in a manner that the upper surface of the insulation layer 14 constitutes almost the same surface as the upper surface of the semiconductor element 2. The insulation layer 14 is made of a thermosetting resin such as an epoxy resin, etc., or a thermosetting resin mixed with a reinforcing material such as silica filler, etc.

An upper insulation film 15 is formed on the upper surfaces of the semiconductor element 2 and insulation layer 14 in a manner that the upper surface thereof is flattened.

The upper insulation film 15 is a so-called buildup material used for a buildup substrate, and made of a thermosetting resin such as an epoxy resin, etc. mixed with a reinforcing material such as silica filler.

Openings 16 are formed in the upper insulation film 15 in the portions corresponding to the central regions of the upper surfaces of the columnar electrodes 12. An upper base metal layer 17 made of copper or the like is formed on the upper surface of the upper insulation film 15. Upper wires 18 made of copper are formed on the entire upper surface of the upper base metal layer 17. One end portion of the upper wire 18 including the corresponding portion of the upper base metal layer 17 is connected to the upper surface of the columnar electrode 12 through the opening 16 in the upper insulation film 15.

An overcoat film 19 made of solder resist or the like is formed on the upper surface of the upper insulation film 15 and the upper surfaces of the upper wires 18. Openings 20 are formed in the overcoat film 19 in the portions corresponding to the connection pad portions of the upper wires 18. Solder balls 21 are formed in and above the openings 20 so as to be connected to the connection pad portions of the upper wires 18.

In a case where the diameter of the columnar electrode 12 is 120 μm, the state-of-the-art manufacture techniques tolerate about 200 μm as the limit of the arranging pitch for the columnar electrodes 12, and about 70 μm as the limit of the arranging pitch for the upper wires 18 (wire width being about 35 μm and wire interval being about 35 μm). In this case, the interval between the columnar electrodes 12 having the diameter of 120 μm and arranged with the arranging pitch of 200 μm is 80 μm, and therefore the number of upper wires 18 having the wire width of 35 μm that can be arranged on the upper surface of the upper insulation film 15 within the interval of 80 μm is 1. Note that the diameter of the opening 16 in the upper insulation film 15 is about 95 μm.

If the largest number of columnar electrodes 12 possible under the above-described conditions are arranged (aligned) on the silicon substrate 4 having the size of 5 mm×5 mm on both sides of each of the two diagonal lines of the silicon substrate 4 in two lines on each side with predetermined pitches for the respective lines, the silicon substrate 4 will be as shown in FIG. 2. Here, lines that are parallel with the diagonal lines 4a and apart therefrom by 100 μm (i.e., ½ of the arranging pitch of 200 μm for the columnar electrodes 12) are referred to as first lines. Lines that are parallel with the first line and apart therefrom by 200 μm (i.e., the same as the arranging pitch for the columnar electrodes 12) are referred to as second lines. The largest number of columnar electrodes 12 possible are arranged on the first lines with the arranging pitch of 200 μm, and the largest number of columnar electrodes 12 possible having the diameter of 120 μm are arranged on the second lines with the arranging pitch of 200 μm.

Figure 19:
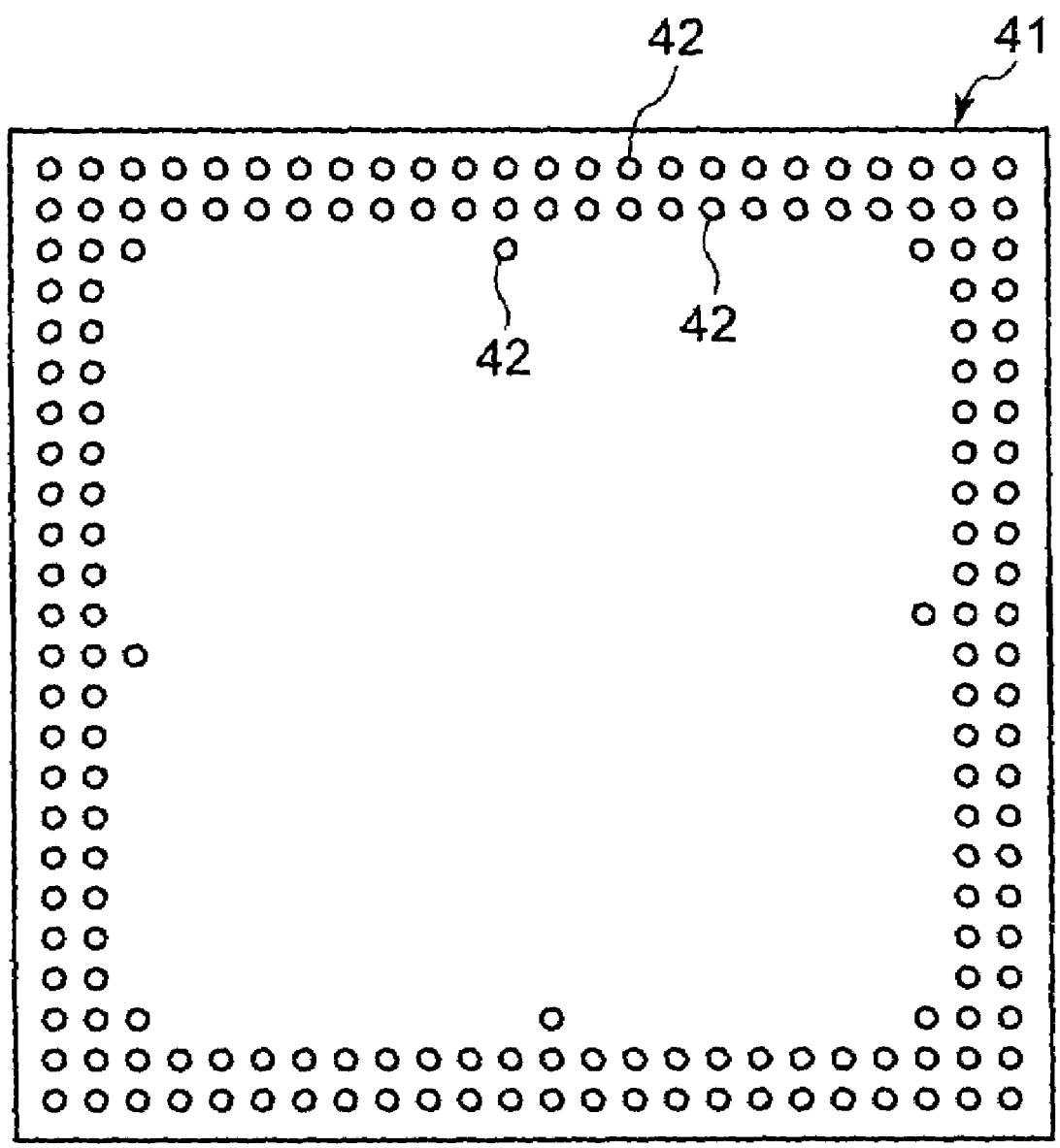
FIG. 19 is a top view similar to FIG. 2 for explaining prior art.
Figure 20:
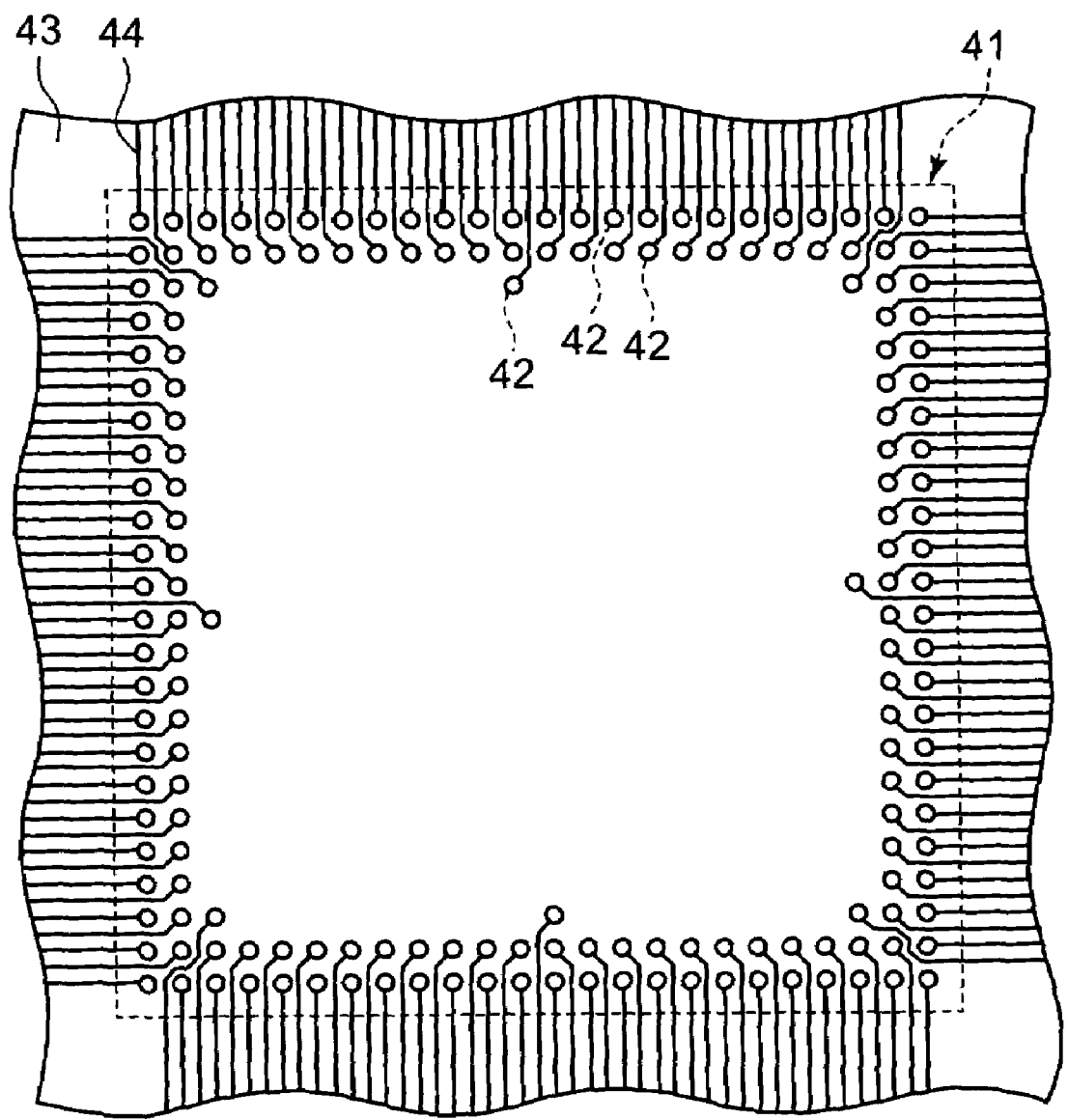
FIG. 20 is a top view similar to FIG. 1 for explaining prior art.

In this case, since the length of the diagonal lines 4a of the silicon substrate 4 is about 7 mm, 32 columnar electrodes 12 are arranged on each first line. The total number of columnar electrodes 12 on the four first lines is 124 according to a calculation "32×4−4=124". There can be arranged 26 columnar electrodes 12 on each second line, and 104 columnar electrodes 12 on the four second lines in total according to a calculation "26×4=104". The grand total is 228 according to a calculation "124+104=228". As compared with the case shown in FIG. 19 where the columnar electrodes 42 are arranged along the four sides of the semiconductor substrate (silicon substrate) 41, 44 (=228−184) more columnar electrodes 12 can be arranged in case of the arrangement shown in FIG. 1 and FIG. 2.

As shown in FIG. 1, the upper wires 18 connected to the columnar electrodes 12 arranged on the first lines (arranged more closely to the diagonal lines 4a) are basically arranged on the upper insulation film 15 within the intervals between the columnar electrodes 12 arranged on the second lines (arranged outside the columnar electrodes 12 arranged more closely to the diagonal lines 4a) one wire in each interval.

In this case, the columnar electrodes 12 arranged on the first lines and the outer columnar electrodes 12 arranged on the second lines are basically arranged at positions where the line connecting the both is perpendicular to the diagonal line 4a. The upper wires 18 connected to the columnar electrodes 12 arranged on the first lines basically have linear portions that are perpendicular to the diagonal lines 4a between the columnar electrodes 12 arranged on the second lines. The upper wires 18 connected to the columnar electrodes 12 arranged on the first lines and the upper wires 18 connected to the columnar electrodes 12 arranged on the second lines are basically extended perpendicularly to the four sides of the silicon substrate 4 outside the columnar electrodes 12 arranged on the second lines.

The size of the base plate 1 is formed larger by a certain degree than the size of the semiconductor element 2, in order to make the range of the region on which the solder balls 21 are to be arranged larger by a certain degree than the range of the semiconductor element 2 in accordance with increase in the number of connection pads 5 on the silicon substrate 4, thereby to make the size and pitch of the connection pad portions of the upper wires 18 (the portions inside the openings 20 in the overcoat film 19) larger than those of the columnar electrodes 12. In this case, since the upper wires 18 are arranged over the region corresponding to the semiconductor element 2 entirely as shown in FIG. 1, the solder balls 21 are arranged only on the locations corresponding to the insulation layer 14 formed on the upper surface of the base plate 1 around the semiconductor element 2.

Figure 4:
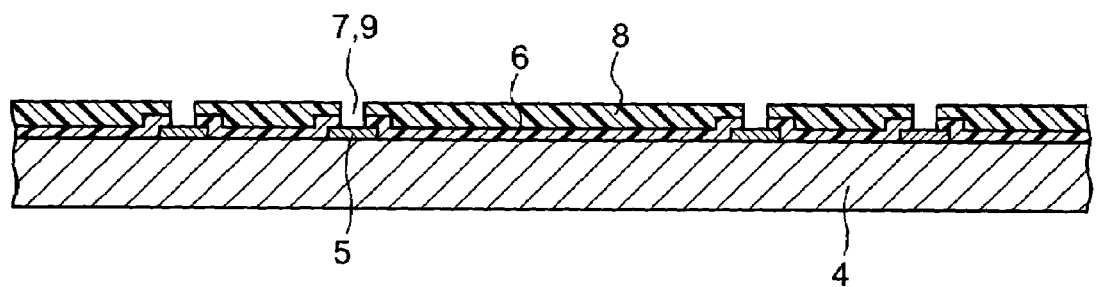
FIG. 4 is a cross section of an initially prepared member in manufacturing the semiconductor element shown in FIG. 3.

Next, one example of the method for manufacturing the present semiconductor device will be explained. First, one example of the method for manufacturing the semiconductor element 2 will be explained. First, as shown in FIG. 4, a silicon substrate (semiconductor substrate) 4 in the form of a wafer is prepared, on which connection pads 5 made of aluminum metal or the like, an insulation film 6 made of silicon oxide or the like, and a protection film 8 made of an epoxy resin, a polyimide resin, or the like are formed wherein the central regions of the connection pads 5 are exposed through opening 7 formed in the insulation film 6 and through openings 9 formed in the protection film 8. An integrated circuit having a specific function is formed on each region where a semiconductor element is to be formed on the silicon substrate 4 in the form of a wafer. The connection pads 5 are electrically connected to the integrated circuits formed on the corresponding regions.

Figure 5:
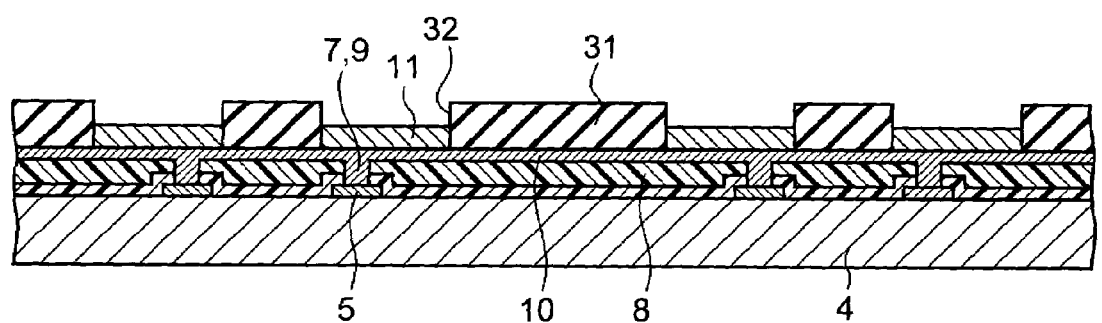
FIG. 5 is a cross section for explaining a manufacturing step following the step shown in FIG. 4.

Next, as shown in FIG. 5, a base metal layer 10 is formed on the entire upper surface of the protection film 8 including the upper surfaces of the connection pads 5 exposed through the openings 7 and 9. In this case, the base metal layer 10 may be a single copper layer formed by electroless plating or a single copper layer formed by sputtering. Or, the base metal layer 10 may be a dual-layer including a thin film of titanium or the like formed by sputtering and a copper layer formed thereon by sputtering.

Next, a pattern of a plating resist film 31 is formed on the upper surface of the base metal layer 10. In this case, openings 32 are formed in the plating resist film 31 in the portions corresponding to where wires 11 are to be formed. Wires 11 are then formed on the upper surface of the base metal layer 10 in the openings 32 of the plating resist film 31, by applying electrolytic copper plating using the base metal layer 10 as plating current paths. The plating resist film 31 is then separated.

Figure 6:
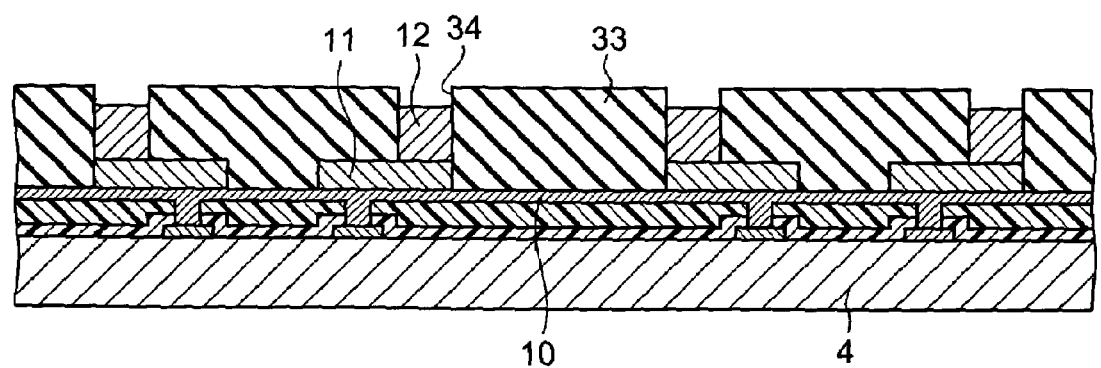
FIG. 6 is a cross section for explaining a manufacturing step following the step shown in FIG. 5.
Figure 7:
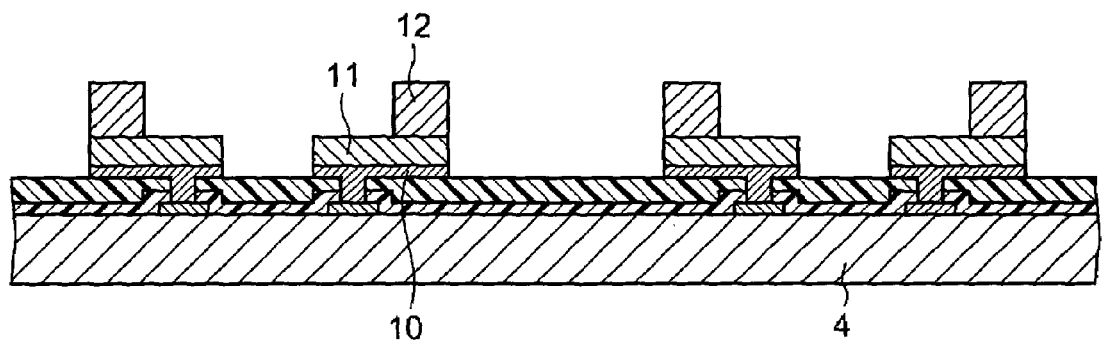
FIG. 7 is a cross section for explaining a manufacturing step following the step shown in FIG. 6.

Next, as shown in FIG. 6, a pattern of a plating resist film 33 is formed on the upper surface of the base metal layer 10 and the upper surfaces of the wires 11. In this case, openings 34 are formed in the plating resist film 33 in the portions corresponding to where columnar electrodes 12 are to be formed. Columnar electrodes 12 are formed on the upper surfaces of the connection pad portions of the wires 111 in the openings 34 of the plating resist film 33, by applying electrolytic copper plating using the base metal layer 10 as plating current paths. The plating resist film 33 is then separated, and unnecessary portions of the base metal layer 10 are etched out by using the wires 11 as a mask. As a result, the base metal layer 10 remains only under the wires 11 as shown in FIG. 7.

Figure 8:
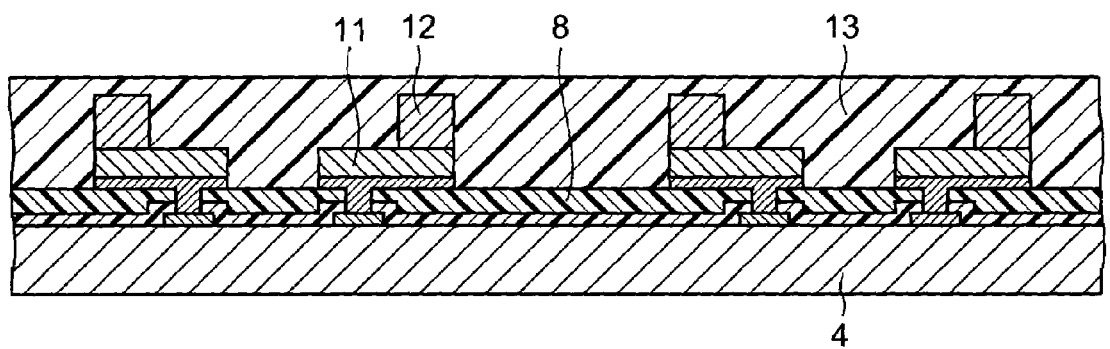
FIG. 8 is a cross section for explaining a manufacturing step following the step shown in FIG. 7.
Figure 9:
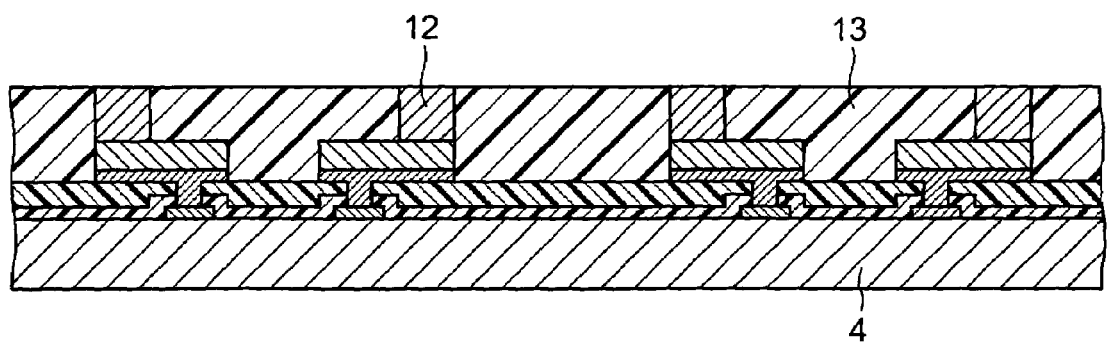
FIG. 9 is a cross section for explaining a manufacturing step following the step shown in FIG. 8.

Next, as shown in FIG. 8, a sealing film 13 made of an epoxy resin, a polyimide resin, or the like is formed on the entire surfaces of the columnar electrodes 12, wires 11, and protection film 8 by screen printing, spin coating, die coating, or the like, in a manner that the thickness of the sealing film 13 is higher than the height of the columnar electrodes 12 Therefore, in this state, the upper surfaces of the columnar electrodes 12 are covered with the sealing film 13.

Next, the upper surface of the sealing film 13 and the upper surfaces of the columnar electrodes 12 are adequately polished to expose the upper surfaces of the columnar electrodes 12 and thereby to flatten the exposed upper surfaces of the columnar electrodes 12 and the upper surface of the sealing film 13. The upper surfaces of the columnar electrodes 12 are adequately polished because there is unevenness in the height of the columnar electrodes 12 formed by electrolytic plating. It is necessary to eliminate the unevenness and make the height of the columnar electrodes 12 uniform.

Figure 10:
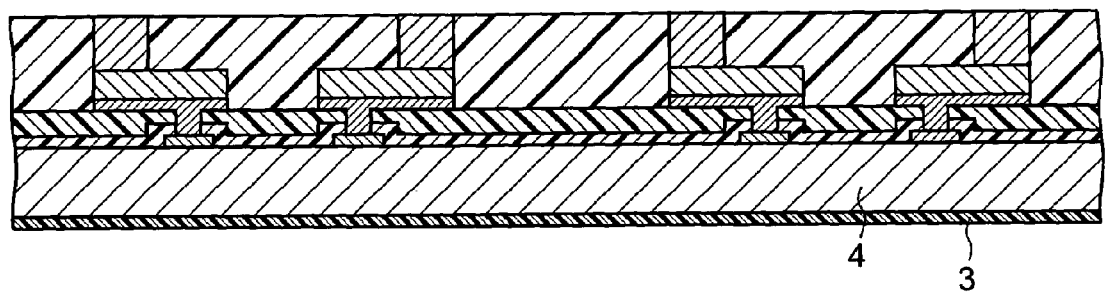
FIG. 10 is a cross section for explaining a manufacturing step following the step shown in FIG. 9.
Figure 11:
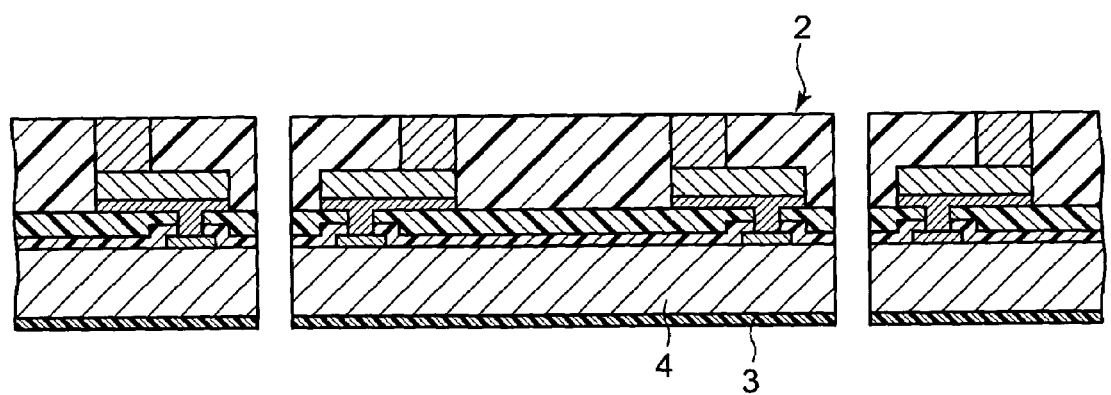
FIG. 11 is a cross section for explaining a manufacturing step following the step shown in FIG. 10.

Next, as shown in FIG. 10, an adhesive layer 3 is adhered to the entire lower surface of the silicon substrate 4. The adhesive layer 3 is made of a die bond material such as an epoxy resin, a polyimide resin, or the like, and is fixed on the silicon substrate 4 in a semi-hardened state by applying heat and pressure thereto. The adhesive layer 3 fixed on the silicon substrate 4 is adhered to a dicing tape (unillustrated) and subjected to a dicing step shown in FIG. 11. After the dicing step, a plurality of semiconductor elements 2 in each of which the adhesive layer 3 is present on the lower surface of the silicon substrate 4 as shown in FIG. 3 can be obtained by separation from the dicing tape.

Since the semiconductor element 2 obtained in the above-described manner has the adhesive layer 3 on the lower surface of the silicon substrate 4, there is no need of doing the very bothersome work of individually adhering an adhesive layer to the lower surface of the silicon substrate 4 of all the semiconductor elements 2 after the dicing step. The work of separating the dicing tape after the dicing step is much easier than the work of individually adhering an adhesive layer to the lower surface of the silicon substrate 4 of all the semiconductor substrates 2 after the dicing step.

Figure 12:
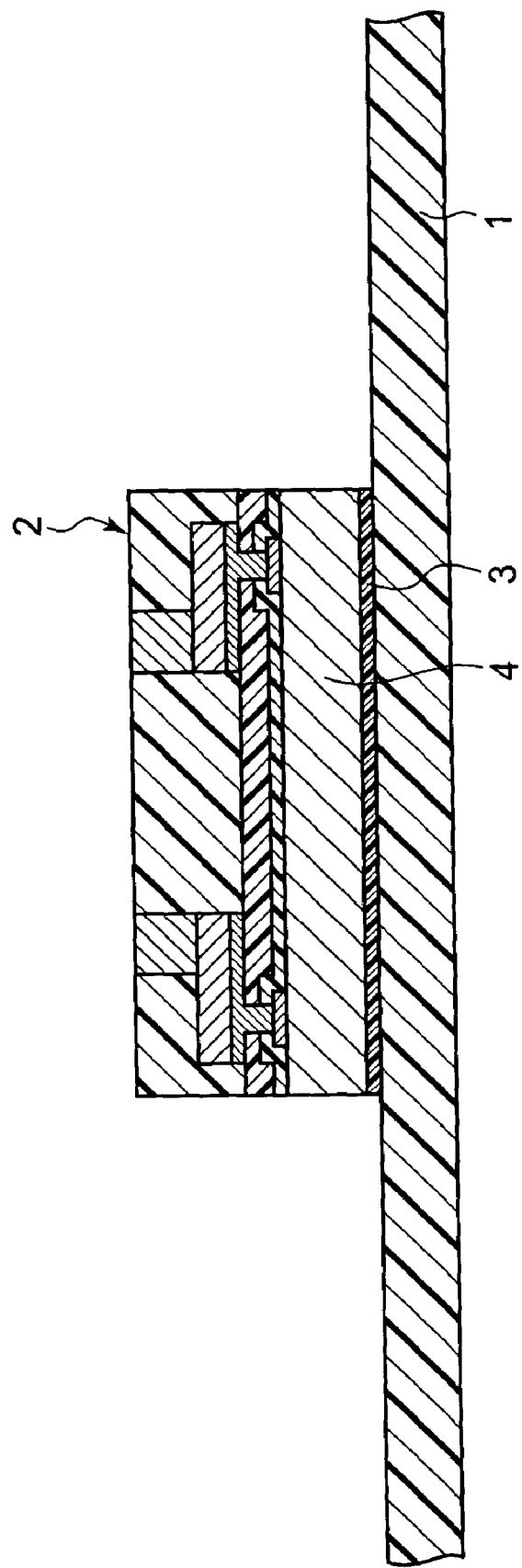
FIG. 12 is a cross section for explaining a manufacturing step following the step shown in FIG. 11.

Next, one example of manufacturing a semiconductor device shown in FIG. 3 using the semiconductor element 2 obtained in the above-described manner will be explained. First, as shown in FIG. 12, a base plate 1 is prepared which has an area allowing the completed semiconductor device shown in FIG. 3 to be formed plurally. The base plate 1 has, for example, a quadrangular shape as seen from the top, although is not limited to this shape. Next, the adhesive layer 3 adhered to the lower surface of the silicon substrate 4 of each semiconductor element 2 is fully hardened by application of heat and pressure, and adhered to the upper surface of the base plate 1 at predetermined positions plurally.

Figure 13:
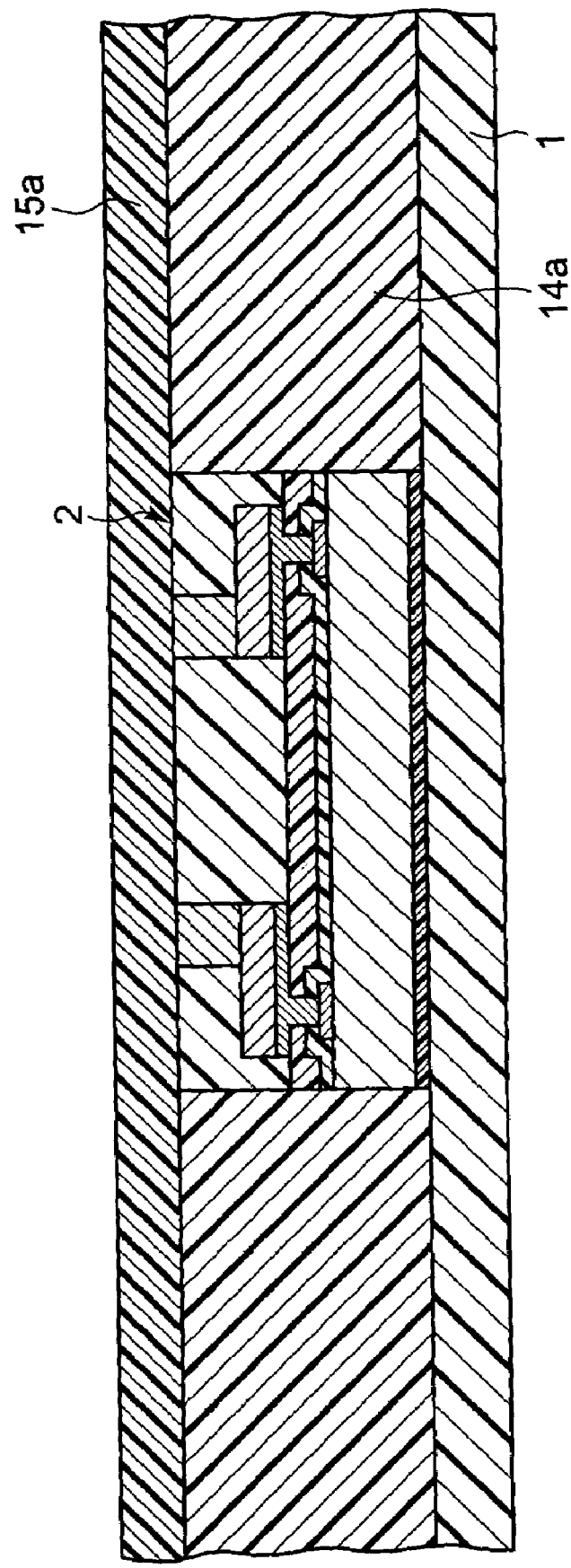
FIG. 13 is a cross section for explaining a manufacturing step following the step shown in FIG. 12.

Next, as shown in FIG. 13, an insulation layer forming layer 14a is formed on the upper surface of the base plate 1 appearing around the semiconductor element 2 by, for example, screen printing, spin coating, etc. The insulation layer forming layer 14a is made of, for example, a thermosetting resin such as an epoxy resin, etc. or a thermosetting resin mixed with a reinforcing material such as silica filler, etc.

Next, an upper insulation film forming sheet 15a is formed on the upper surfaces of the semiconductor element 2 and insulation layer forming layer 14a. The upper insulation film forming sheet 15a may be made of a thermosetting resin such as an epoxy resin, etc. which is semi-hardened after mixed with silica filler.

Figure 14:
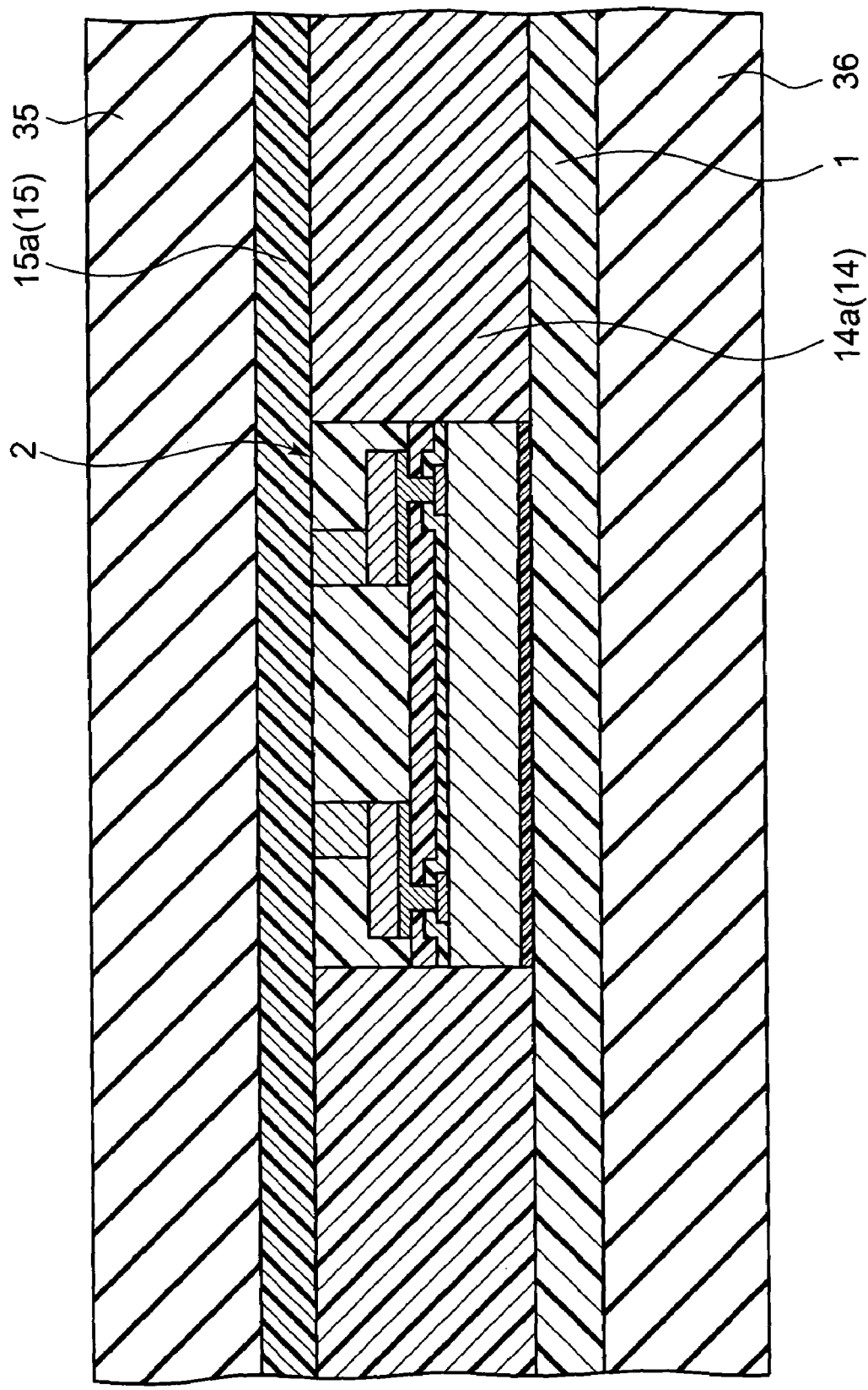
FIG. 14 is a cross section for explaining a manufacturing step following the step shown in FIG. 13.

Next, as shown in FIG. 14, the insulation layer forming layer 14a and the upper insulation film forming sheet 15a are heated and pressurized from both the above and beneath by using a pair of heating/pressurizing plates 35 and 36. As a result, an insulation layer 14 is formed on the upper surface of the base plate 1 appearing around the semiconductor element 2 and an upper insulation film 15 is formed on the upper surfaces of the semiconductor element 2 and insulation layer 14. In this case, the upper surface of the upper insulation film 15 becomes a flat surface because it is pressed by the lower surface of the upper heating/pressurizing plate 35. Therefore, a polishing step for flattening the upper surface of the upper insulation film 15 becomes unnecessary.

Figure 15:
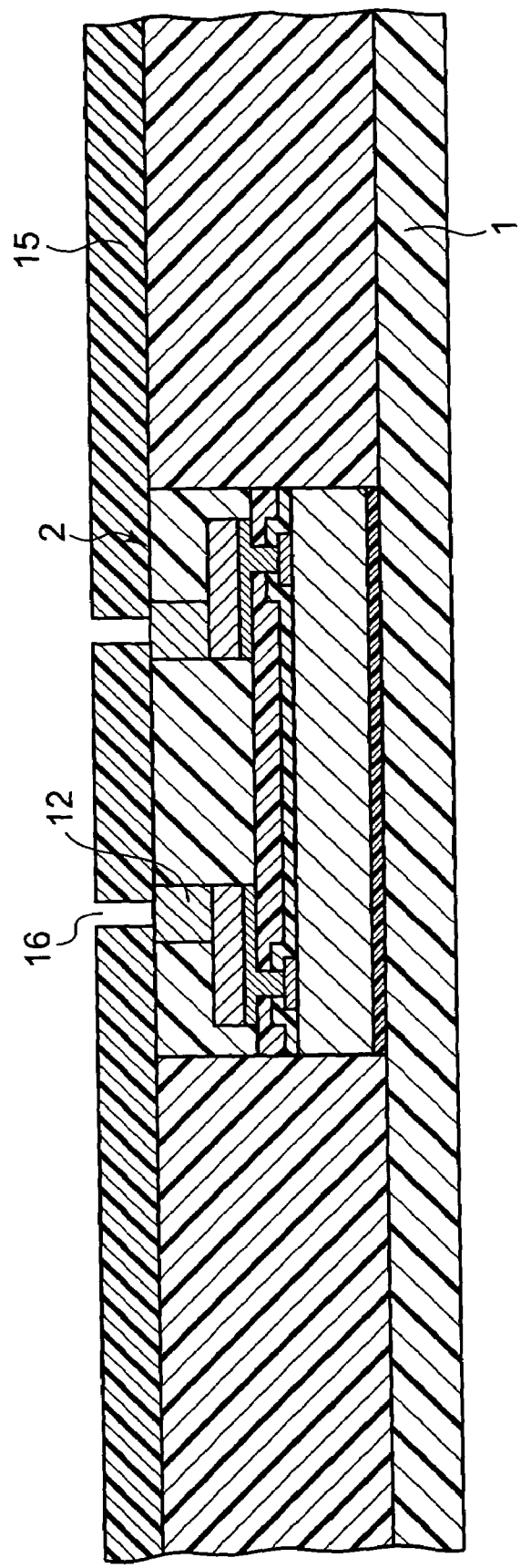
FIG. 15 is a cross section for explaining a manufacturing step following the step shown in FIG. 14.
Figure 16:
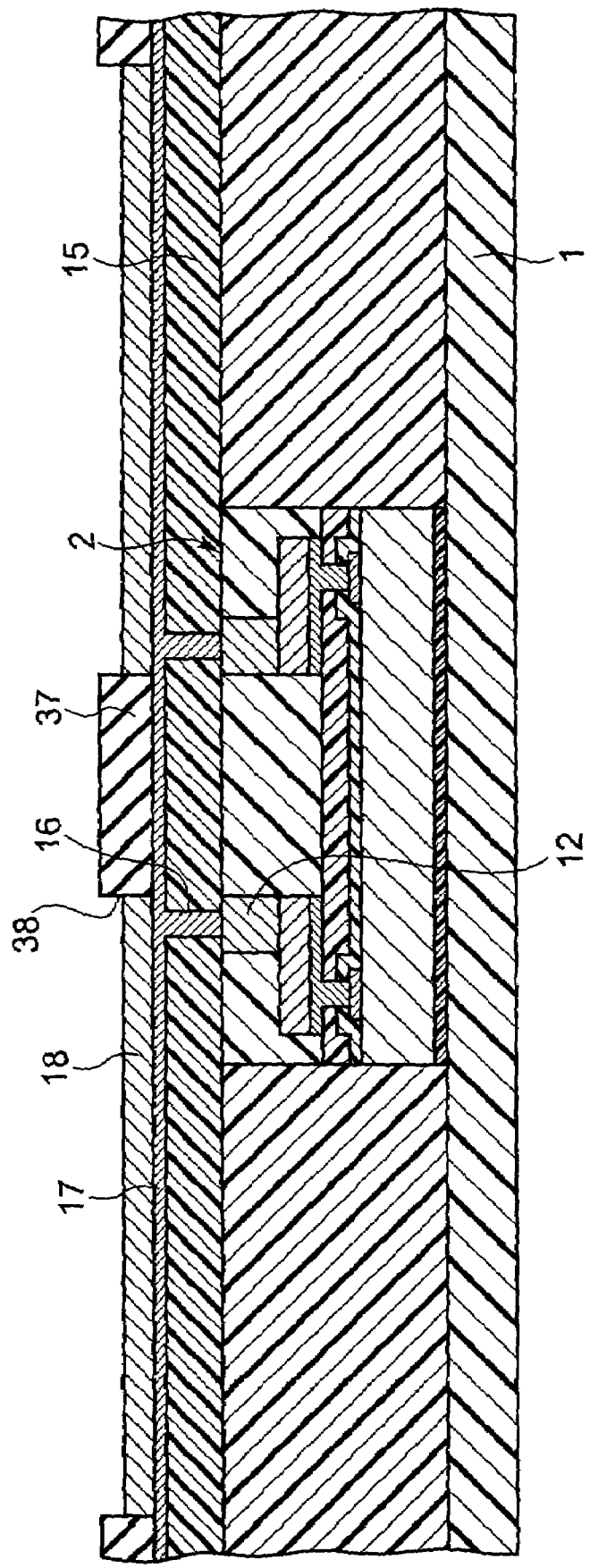
FIG. 16 is a cross section for explaining a manufacturing step following the step shown in FIG. 15.

Next, as shown in FIG. 15, openings 16 are formed in the upper insulation film 15 in the portions corresponding to the central regions of the upper surfaces of the columnar electrodes 12 by applying laser treatment for irradiating laser beams. Next, epoxy smears or the like that occur in the openings 16 and the like are removed by applying desmear treatment, if such smears do occur. Next, as shown in FIG. 16, an upper base metal layer 17 is formed on the entire upper surface of the upper insulation film 15 including the upper surfaces of the columnar electrodes 12 exposed through the openings 16 by electroless copper plating. A pattern of a plating resist film 37 is then formed on the upper surface of the upper base metal layer 17. In this case, openings 38 are formed in the plating resist film 37 in the portions corresponding to where upper wires 18 are to be formed.

Figure 17:
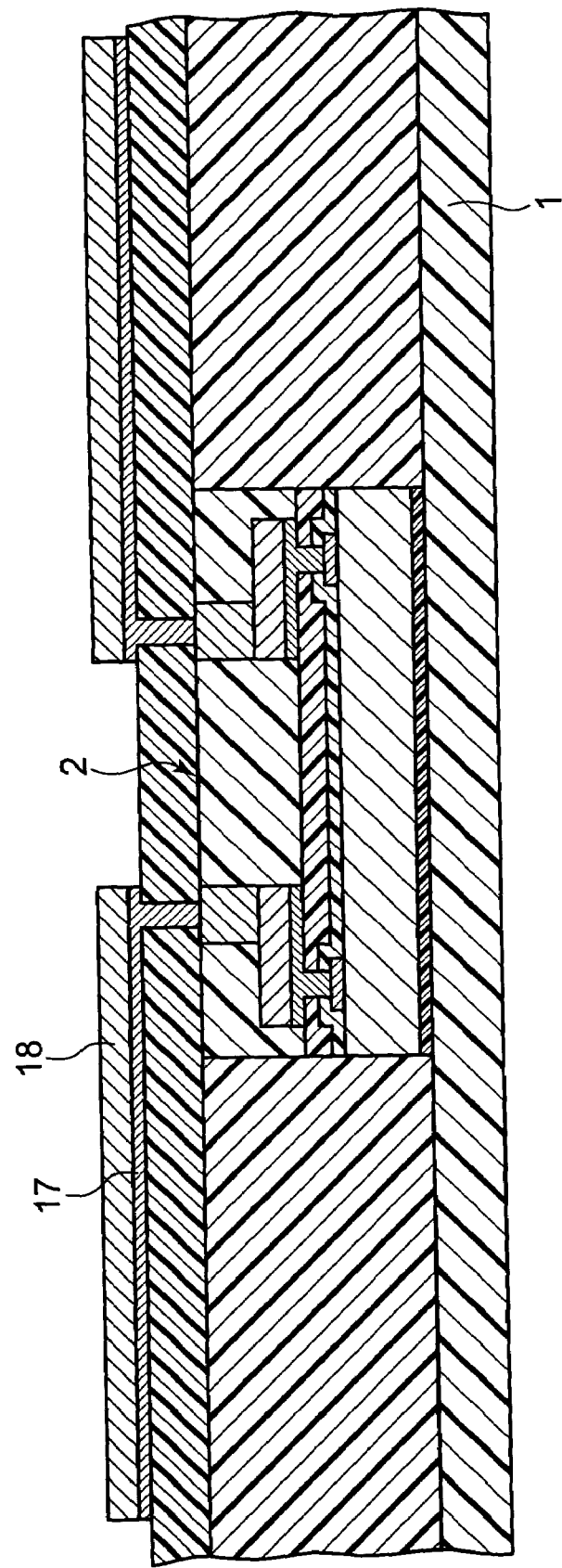
FIG. 17 is a cross section for explaining a manufacturing step following the step shown in FIG. 16.

Next, upper wires 18 are formed on the upper surface of the upper base metal layer 17 in the openings 38 formed in the plating resist film 37, by applying electrolytic copper plating using the upper base metal layer 17 as plating current paths. Next, the plating resist film 37 is separated and unnecessary portions of the upper base metal layer 17 are etched out by using the upper wires 18 as a mask. As a result, the upper base metal layer 17 remains only under the upper wires 18 as shown in FIG. 17.

Figure 18:
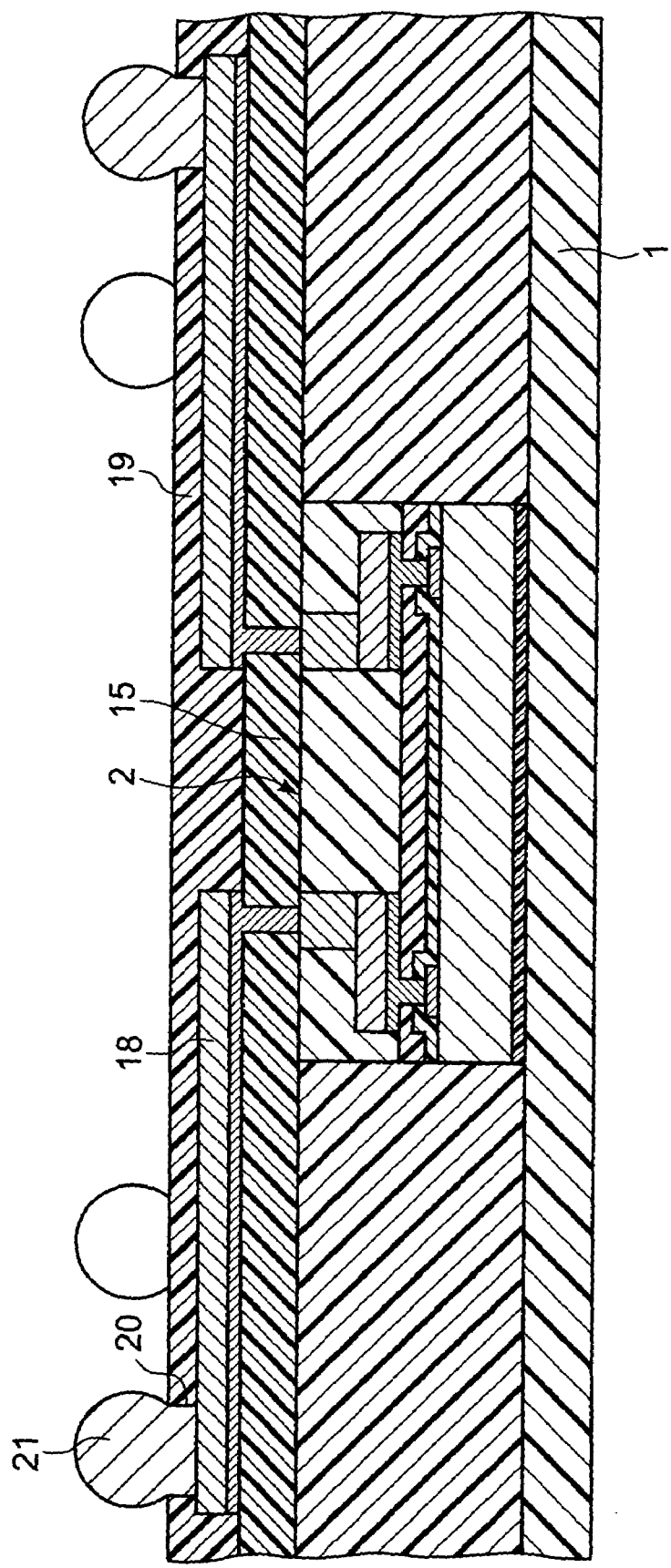
FIG. 18 is a cross section for explaining a manufacturing step following the step shown in FIG. 17.

Next, as shown in FIG. 18, an overcoat film 19 made of solder resist or the like is formed on the entire surfaces of the upper wires 18 and upper insulation film 15 by screen printing or the like. In this case, openings 20 are formed in the overcoat film 19 in the portions corresponding to the connection pad portions of the upper wires 18. Next, solder balls 21 are formed in and above the openings 20 so as to be connected to the connection pad portions of the upper wires 18. Next, the overcoat film 19, the upper insulation film 15, the insulation layer 14, and the base plate 1 are diced between any adjacent two semiconductor elements 2. As a result, a plurality of the semiconductor device shown in FIG. 3 are obtained.

As described above, according to the above-described manufacturing method, a plurality of semiconductor devices are obtained by arranging a plurality of semiconductor elements 2 on the base plate 1, forming the upper wires 18 and the solder balls 21 simultaneously on the plurality of semiconductor elements 2, and dicing them from one another. Therefore, the manufacturing process can be simplified. Further, since the plurality of semiconductor elements 2 can be carried simultaneously with the base plate 1 in and after the manufacturing step shown in FIG. 14, this also contributes to simplification of the manufacturing process.

Another Embodiment

In the above-described embodiment, the semiconductor element 2 comprises the columnar electrodes 12 as external connection electrodes. The present invention is not limited to this, but the semiconductor element 2 may be configured in a manner that it comprises neither the columnar electrodes 12 nor the sealing film 13, but comprises an overcoat film made of solder resist or the like that covers the wires 11 except their connection pad portions, and upper connection pads each having a base metal layer thereunder are formed as external connection electrodes on the connection pad portions of the wires 11 and on the overcoat film near the connection pad portions. Further, the silicon substrate 4 of the semiconductor element 2 and the base plate 1 may be rectangular.

According to the present invention, when a plurality of external connection electrodes formed of columnar electrodes or the like are arranged in plural lines along the diagonal lines of a semiconductor substrate having a quadrangular shape as seen from the top, a larger number of external connection electrodes formed of columnar electrodes or the like can be arranged than in a case where such external connection electrodes are arranged along the four sides of the semiconductor substrate.

Various embodiments and changes may be made thereunto without departing from the broad spirit and scope of the invention. The above-described embodiments are intended to illustrate the present invention, not to limit the scope of the present invention. The scope of the present invention is shown by the attached claims rather than the embodiments. Various modifications made within the meaning of an equivalent of the claims of the invention and within the claims are to be regarded to be in the scope of the present invention.

This application is based on Japanese Patent Application No. 2004-72265 filed on May 15, 2004 and including specification, claims, drawings and summary. The disclosure of the above Japanese Patent Application is incorporated herein by reference in its entirety.

What is claimed is:

1. A semiconductor device comprising:
a semiconductor substrate having a top surface which has a quadrangular shape;
a plurality of connection pads formed on the top surface of the semiconductor substrate;
an insulation film formed on the top surface of the semiconductor substrate except the connection pads;
a plurality of external connection electrodes formed on the insulation film so as to be connected to the connection pads; and
a sealing film provided in between the external connection electrodes;
wherein the plurality of external connection electrodes comprise a first group of external connection electrodes which are arranged in first lines running along two diagonal lines of the semiconductor substrate and a second group of external connection electrodes which are arranged in second lines running along the first lines outside of the first lines with respect to the diagonal lines; and
wherein an upper insulation film having openings corresponding to the external connection electrodes is formed on the sealing film and the external connection electrodes, and upper wires which are connected to the external connection electrodes are formed on the upper insulation film.

2. The semiconductor device according to claim 1, wherein the first group of external connection electrodes are arranged to make one pair of the first lines for each of the two diagonal lines, such that each said pair of the first lines is symmetrical with respect to the corresponding diagonal line.

3. The semiconductor device according to claim 1, wherein the second group of external connection electrodes are arranged to make one pair of the second lines for each of the two diagonal lines, such that each said pair of the second lines is symmetrical with respect to the corresponding diagonal line.

4. The semiconductor device according to claim 1, further comprising wires on the insulation film which are connected to the connection pads, respectively, wherein each of the external connection electrodes is formed on at least one of the wires.

5. The semiconductor device according to claim 1, wherein the upper wires connected to the external connection electrodes included in the first group are routed so as to run between the external connection electrodes included in the second group.

6. The semiconductor device according to claim 5, wherein each of the upper wires connected to the external connection electrodes included in the first group has a portion which extends substantially perpendicularly to either one of the two diagonal lines.

7. The semiconductor device according to claim 1, wherein the external connection electrodes included in the first group and the external connection electrodes included in the second group are arranged at positions such that a line connecting any one of the external connection electrodes in one of the groups to an adjacent one of the external connection electrodes in the other one of the groups is substantially perpendicular to either one of the two diagonal lines.

8. The semiconductor device according to claim 1, wherein each of the upper wires connected to the external connection electrodes included in the first and second groups has a portion which extends substantially perpendicularly to any one of sides of the semiconductor substrate.

9. The semiconductor device according to claim 1, wherein an insulation layer is formed around the semiconductor substrate and the sealing film, and the upper insulation film extends over the insulation layer.

10. The semiconductor device according to claim 9, wherein at least a part of each of the upper wires extends over the insulation layer.

11. The semiconductor device according to claim 1, wherein a largest possible number of external connection electrodes are included in the first group and a largest possible number of external connection electrodes are included in the second group, and the external connection electrodes are arranged on the semiconductor substrate in the first and second lines such that two lines of the external connection electrodes are arranged with predetermined arranging pitches on both sides of each of the two diagonal lines.

12. The semiconductor device according to claim 1, wherein the top surface of the semiconductor substrate has a square shape.

13. The semiconductor device according to claim 1, wherein each of the external connection electrodes is a columnar electrode.

14. The semiconductor device according to claim 1, wherein the external connection electrodes are upper connection pads which are formed on connection pad portions of wires which are formed on the insulation film so as to be connected to the connection pads on the top surface of the semiconductor substrate.

15. A semiconductor device comprising:

a semiconductor element including a semiconductor substrate having a top surface which has a quadrangular shape, and a plurality of external connection electrodes formed on the semiconductor substrate;

an insulation layer formed around the semiconductor element; and wires formed on the semiconductor element and the insulation layer so as to be connected to the external connection electrodes of the semiconductor element;

wherein the external connection electrodes are arranged at least in plural lines along each of two diagonal lines of the semiconductor substrate, and the wires that are connected to the a first group of the external connection electrodes that are arranged closer to the diagonal lines have portions which are routed to run between a second group of the external connection electrodes that are arranged outside of the first group of the external connection electrodes with respect to the diagonal lines, and wherein at least one of the wires has a connection pad portion which is positioned over the insulation layer.

16. The semiconductor device according to claim 15, wherein the plurality of external connection electrodes are arranged on the semiconductor substrate in plural lines with predetermined arranging pitches on each side of each of the two diagonal lines.

17. The semiconductor device according to claim 15, wherein each of the wires connected to the first group of the external connection electrodes has a portion which is routed to be substantially perpendicular to one of the diagonal lines.

18. The semiconductor device according to claim 15, wherein a solder ball is formed on the connection pad portion of said at least one of the wires.

* * * * *